(12) United States Patent
Standingford et al.

(10) Patent No.: US 12,094,058 B2
(45) Date of Patent: Sep. 17, 2024

(54) FAST FEATURE RECOGNITION AND MESH GENERATION IN STRUCTURAL DESIGN

(71) Applicant: Fluid Dynamic Sciences, LLC, Fort Worth, TX (US)

(72) Inventors: David Standingford, Chepstow (GB); Jamil Appa, Bristol (GB); James Sharpe, Bath (GB); Wenhao Zhang, Bristol (GB)

(73) Assignee: FLUID DYNAMIC SCIENCES, LLC, Fort Worth, TX (US)

( * ) Notice: Subject to any disclaimer, the term of this patent is extended or adjusted under 35 U.S.C. 154(b) by 94 days.

(21) Appl. No.: 17/984,210

(22) Filed: Nov. 9, 2022

(65) Prior Publication Data
US 2024/0062465 A1    Feb. 22, 2024

Related U.S. Application Data

(60) Provisional application No. 63/399,351, filed on Aug. 19, 2022.

(51) Int. Cl.
*G06T 17/20* (2006.01)
*G06F 30/20* (2020.01)
(Continued)

(52) U.S. Cl.
CPC ............ *G06T 17/20* (2013.01); *G06F 30/20* (2020.01); *G06T 5/40* (2013.01); *G06V 10/422* (2022.01); *G06V 10/761* (2022.01)

(58) Field of Classification Search
CPC .................. G06V 10/422; G06T 17/20
See application file for complete search history.

(56) References Cited

U.S. PATENT DOCUMENTS

| 8,970,590 B1 | 3/2015 | Brennan et al. |
| 2019/0035150 A1 | 1/2019 | Owechko |

(Continued)

FOREIGN PATENT DOCUMENTS

| CN | 110288712 A | * | 9/2019 | ............ G06T 17/20 |
| CN | 113628263 A | | 11/2021 | |

OTHER PUBLICATIONS

Yang, J. et al., "A fast and robust local descriptor for 3D point cloud registration", Information Sciences, Feb. 2016, 22 pages.
(Continued)

*Primary Examiner* — Charles Tseng
(74) *Attorney, Agent, or Firm* — Leffler Intellectual Property Law, PLLC; Kenneth B. Leffler

(57) ABSTRACT

A structural feature of a structure is identified by obtaining a global point cloud representation of the structure and obtaining a target point cloud that represents a target structural feature, wherein the target point cloud is a subset of the global point cloud representation of the structure. The global structural information and the target point cloud are supplied to a global registration process that produces a globally registered representation of the structure, wherein the global structural information is derived from the global point cloud representation of the structure. The globally registered representation of the structure and the target point cloud are supplied to a local registration process that produces one or more matching point clouds, wherein each of the one or more matching point clouds is a subset of the global point cloud representation of the structure. Mesh generation rules may then be applied at each of the matching point clouds to generate, for the matching point clouds, corresponding volumes having a mesh spacing, a size, and a pose suitable for the locales of the respective matching point clouds.

57 Claims, 12 Drawing Sheets

(51) Int. Cl.
*G06T 5/40* (2006.01)
*G06V 10/422* (2022.01)
*G06V 10/74* (2022.01)

(56) References Cited

U.S. PATENT DOCUMENTS

2019/0319851 A1 10/2019 Eckart et al.
2020/0342614 A1 10/2020 Yan et al.
2023/0080380 A1* 3/2023 Hajjar ................... G06T 17/20
 700/97

OTHER PUBLICATIONS

Liu, Y. et al., "A Point Cloud Registration Algorithm Based on Feature Extraction and Matching", Hindawi, Mathematical Problems in Engineering, vol. 2018, Article ID 7352691, Dec. 24, 2018, 10 pages.

Jien, S. et al., "Automatic Tool for Improving the Meshing Efficiency for Thin-Walled Objects-Mid_Surface Mesh Generation Utilizing Shape Recognition", SAE Int. J. Mater. Manuf., vol. 11, 2018, WCX18 Best Papers Special Issue, downloaded from SAE International by John Wootress, Thursday, Jul. 21, 2022, pp. 361-372.

Zhou, Q. et al., "Fast Global Registration", Intel Labs, Date Unknown, pp. 1-16, 2016.

Rusinkiewicz, S. et al., "Efficient Variants of the ICP Algorithm", Stanford University, pp. 1-8, 2001.

Gelfand, N. et al., "Robust Global Registration", Eurographics Symposium on Geometry Processing (2005), 10 pages.

Unknown, ICP Registration, downloaded Jun. 26, 2022 from http://vecg.cs.ucl.ac.uk/Projects/SmartGeometry/global_registration/paper_docs/global_registration_sgp_05.pdf, 5 pages.

Rusu, R.B. et al., "Fast Point Feature Histograms (FPFH) for 3D Registration", 2009 IEEE International Conference on Robotics and Automation, May 12-17, 2009, 6 pages.

PCT International Search Report, mailed Nov. 14, 2023, in connection with International Application No. PCT/US2023/030585, all pages.

PCT Written Opinion, mailed Nov. 14, 2023, in connection with International Application No. PCT/US2023/030585, all pages.

Wu, B. et al., "Feature Interactive Representation for Point Cloud Registration", 2021 IEEE/CVF International Conference on Computer Vision (ICCV), Jan. 1, 2021, pp. 5510-5519, retrieved on Oct. 15, 2023, https://www.computer.org/csdl/proceedings-article/iccv/2021/281200f510/1BmFkzf6Hum>.

* cited by examiner 500 (Global Point Cloud)

701

703
701

703

705
Volume with rule-defined mesh spacing

FAST FEATURE RECOGNITION AND MESH GENERATION IN STRUCTURAL DESIGN

CROSS-REFERENCE TO RELATED APPLICATIONS

This application claims the benefit of U.S. Provisional Application No. 63/399,351, filed Aug. 19, 2022, which is hereby incorporated herein by reference in its entirety.

COPYRIGHT

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

The present invention relates to computational engineering technology, and more particularly to technology for recognizing features within a computationally designed structure.

Computational engineering analysis processes typically apply an algorithm to a digital representation of a Product. For example in computational fluid dynamics, a mesh is generated that represents the shape of the product and forms a basis for the flow features around the product. As is known in the art, a mesh is a discrete representation of a subsection of a continuous geometric space.

Mesh areas of a design are not generally uniform in size but are smaller and of higher concentration in those areas of a volume where there are features of interest having higher complexity, such as but not limited to flow features in an aircraft fuselage design.

A problem with conventional computational design technology arises from the fact that specification and identification of meshes in a design remains largely a human endeavor. In some circumstances, a person may need to labor over a design to identify all of the places where features having particular characteristics exist. And even in some technology that achieves some level of automation, a great deal of time and effort is required for a person to manually complete user-driven menus to characterize the features that are to be located within the structure.

Another problem with conventional computational design technology is the relatively slow speed of execution. The inventors of the subject matter described herein have determined, through investigation and inventive skill, that a contributing factor in this regard relates to the conventional way that a structural design is encoded (e.g., tessellation data, vector representations supplied as output from computer aided design programs, etc.).

In view of the foregoing, there is a need for technology that addresses the above and/or related problems.

SUMMARY

It should be emphasized that the terms "comprises" and "comprising", when used in this specification, are taken to specify the presence of stated features, integers, steps or components; but the use of these terms does not preclude the presence or addition of one or more other features, integers, steps, components or groups thereof.

Moreover, reference letters may be provided in some instances (e.g., in the claims and summary) to facilitate identification of various steps and/or elements. However, the use of reference letters is not intended to impute or suggest that the so-referenced steps and/or elements are to be performed or operated in any particular order.

In accordance with one aspect of the present invention, the foregoing and other objects are achieved in technology (e.g., methods, apparatuses, nontransitory computer readable storage media, program means) that identifies a structural feature of a structure. In an aspect of some but not necessarily all embodiments consistent with the invention, identifying the structural feature involves obtaining a global point cloud representation of the structure and obtaining a target point cloud that represents a target structural feature, wherein the target point cloud is a subset of the global point cloud representation of the structure. The global structural information and the target point cloud are supplied to a global registration process that produces a globally registered representation of the structure, wherein the global structural information is derived from the global point cloud representation of the structure. The globally registered representation of the structure and the target point cloud are supplied to a local registration process that produces one or more matching point clouds, wherein each of the one or more matching point clouds is a subset of the global point cloud representation of the structure.

In another aspect of some but not necessarily all embodiments consistent with the invention, the global structural information is the global point cloud representation of the structure.

In yet another aspect of some but not necessarily all embodiments consistent with the invention, identifying the structural feature involves producing a set of one or more extracted structural features based on the global point cloud representation of the structure, wherein each of the one or more extracted structural features is a pose invariant characterization of a local geometry around a point in the global point cloud representation of the structure, and wherein the global structural information is the set of one or more extracted structural features. In another aspect of some but not necessarily all such embodiments, producing the set of one or more extracted structural features based on the global point cloud representation of the structure comprises determining a Point Feature Histogram (PFH) based on the global point cloud representation of the structure. In one possible alternative, producing the set of one or more extracted structural features based on the global point cloud representation of the structure comprises determining a Fast Point Feature Histogram (FPFH) based on the global point cloud representation of the structure.

In another aspect of some but not necessarily all embodiments consistent with the invention, identifying the structural feature involves downsampling the global point cloud representation of the structure to produce a downsampled global point cloud representation of the structure, wherein producing the set of one or more extracted structural features based on the global point cloud representation of the structure comprises producing the set of one or more extracted structural features from the downsampled global point cloud representation of the structure.

In yet another aspect of some but not necessarily all embodiments consistent with the invention, producing the one or more matching point clouds comprises identifying a subset of a locally registered representation of the structure as one of the one or more matching point clouds when a comparison between the subset of the locally registered representation of the structure and the target structural feature produces a predefined comparison result.

In yet another aspect of some but not necessarily all embodiments consistent with the invention, the predefined comparison result is a predefined root mean square error between the subset of the locally registered representation of the structure and the target structural feature.

In still another aspect of some but not necessarily all embodiments consistent with the invention, the global registration process is a RANdom SAmple Consensus (RANSAC) process.

In another aspect of some but not necessarily all embodiments consistent with the invention, the local registration process comprises determining an Iterative Closest Point (ICP) value.

In yet another aspect of some but not necessarily all embodiments consistent with the invention, obtaining the global point cloud representation of the structure comprises one or more of:

obtaining point cloud data by converting a CAD geometric representation of the structure;

obtaining point cloud data by converting a shape discretization representation of the structure;

obtaining point cloud data by converting a surface mesh representation of the structure;

obtaining point cloud data by converting a volume mesh representation of the structure; and obtaining point cloud data by converting sensor data collected during a flight test of the structure;

obtaining point cloud data by converting sensor data collected during a physical test of the structure.

In still another aspect of some but not necessarily all embodiments consistent with the invention, identifying the structural feature involves obtaining a rule that describes a volume associated with the target structural feature, and obtaining contextual information about a locale of the target structural feature. For each of the one or more matching point clouds, a corresponding volume is produced, wherein the corresponding volume has a mesh spacing, a size, and a pose, and wherein further the mesh spacing is produced in accordance with the rule; and the size and pose are each produced based on the contextual information about the locale of the target structural feature and on contextual information about the locale of said each of the one or more matching point clouds.

In another aspect of some but not necessarily all embodiments consistent with the invention, identifying the structural feature involves obtaining one or more additional target point clouds that represent the target structural feature, wherein the one or more additional target point clouds are differently sized from one another and from the target point cloud. For each of the one or more additional target point clouds, the global structural information and said each of the one or more additional target point clouds are supplied to the global registration process that produces therefrom one or more additional globally registered representations of the structure. For each of the one or more additional target point clouds, the globally registered representation of the structure and said each of the one or more additional target point clouds are supplied to the local registration process that produces therefrom one or more additional sets of one or more matching point clouds.

In another aspect of some but not necessarily all embodiments consistent with the invention, a computer program product is configured for carrying out any one or more of the aspects herein described.

In yet another aspect of some but not necessarily all embodiments consistent with the invention, a nontransitory computer readable storage medium comprises program instructions that, when executed by one or more processors, carries out any one or more of the aspects herein described.

In another aspect of some but not necessarily all embodiments consistent with the invention, a system comprising one or more processors configured to carry out any one or more of the aspects herein described.

In yet another aspect of some but not necessarily all embodiments consistent with the invention, a structural feature recognizer for use in computational engineering is provided, wherein the structural feature recognizer is configured to carry out any one or more of the aspects herein described.

In still another aspect of some but not necessarily all embodiments consistent with the invention, computational engineering system is provided that comprises a structural feature recognizer for use in computational engineering, wherein the structural feature recognizer is configured to carry out any one or more of the aspects herein described.

BRIEF DESCRIPTION OF THE DRAWINGS

The objects and advantages of the invention will be understood by reading the following detailed description in conjunction with the drawings in which.

DETAILED DESCRIPTION

Figure 1:
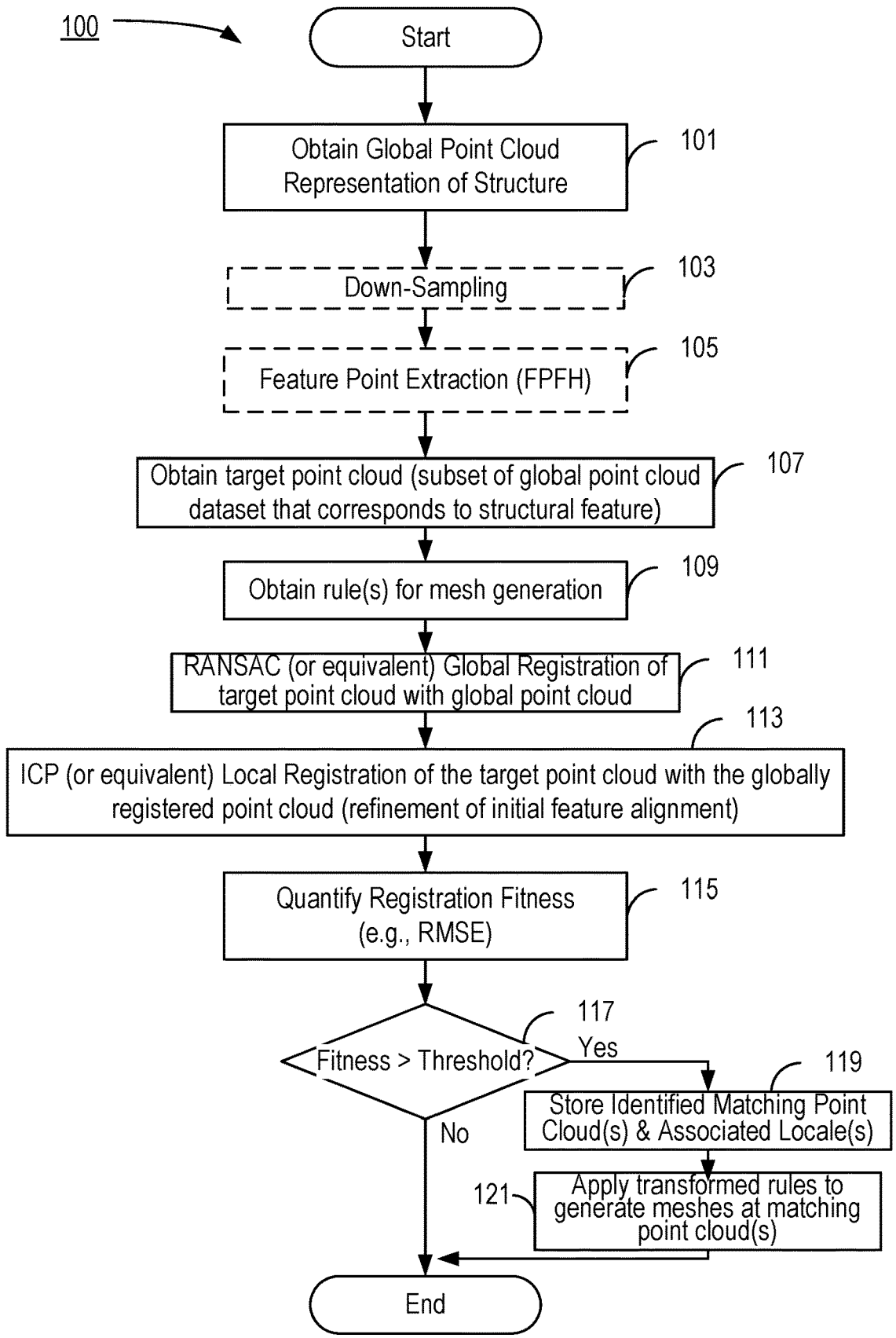
FIG. 1 is, in one respect, a flowchart of actions of a structural feature identifier consistent with the invention.

The various features of the invention will now be described with reference to the figures, in which like parts are identified with the same reference characters.

The various aspects of the invention will now be described in greater detail in connection with a number of exemplary embodiments. To facilitate an understanding of the invention, many aspects of the invention are described in terms of sequences of actions to be performed by elements of a computer system or other hardware capable of executing programmed instructions. It will be recognized that in each of the embodiments, the various actions could be performed by specialized circuits (e.g., analog and/or discrete logic gates interconnected to perform a specialized function), by one or more processors programmed with a suitable set of instructions, or by a combination of both. The term "circuitry configured to" perform one or more described actions is used herein to refer to any such embodiment (i.e., one or more specialized circuits alone, one or more programmed processors, or any combination of these). Moreover, the invention can additionally be considered to be embodied entirely within any form of non-transitory computer readable carrier, such as solid-state memory, magnetic disk, or optical disk containing an appropriate set of computer instructions that would cause a processor to carry out the techniques described herein. Thus, the various aspects of the invention may be embodied in many different forms, and all such forms are contemplated to be within the scope of the invention. For each of the various aspects of the invention, any such form of embodiments as described above may be referred to herein as "logic configured to" perform a described action, or alternatively as "logic that" performs a described action.

One aspect of inventive embodiments is the use of a point cloud representation of a structural design. Unlike the conventional use of, for example, named elements and geometric types, the use of point clouds is more flexible and facilitates the adaptation of recent advances in machine vision technology for a new purpose, namely, solving feature recognition in a structural design.

Another aspect of inventive embodiments is feature recognition/identification by means of recognition of geometric similarity and registration. Unlike conventional technology, the embodiments consistent with the invention can detect similarity that is not constrained by dimension or type, because the underlying data structure is simply an arbitrary set of points in 3D space (i.e., a point cloud).

Yet another aspect of some but not necessarily all inventive embodiments is the modification of mesh generation rules based on locale-related contextual information and the application of the modified rules to automatically identified structural features.

These and other aspects are now described in further detail in the following discussion.

Registration algorithms are known in the art and are widely used in image processing applications. The goal of registration is typically to transform a collection of separate data sets so that they are all relative to a same coordinate system. This is useful, for example, when it is desired to overlay separately obtained images (e.g., any combination of photographs, sensor data, computer generated images, etc.) to produce a single image. One of many possible exemplary uses of registration can be found in augmented reality technology, in which computer generated graphic images are overlayed on top of one or more real world images. It is registration that allows the user to experience the computer generated image as existing at the intended location of the real world.

The inventors have recognized, through investigation and inventive skill, that registration algorithms can be used outside the context of image processing, and more particularly for the purpose of locating structural features that match a target feature of interest within a global structure. However, the fast global registration of sub-scale features within a much larger shape is a difficult problem, especially when point cloud representations are used. Machine vision for automation tend to assume a similar number of points and scales in the source and target point clouds and registration is preceded by a segmentation step (splitting the target into multiple separate parts, one of which will match the source—for example a moving car in a machine vision system based on LIDAR).

The inventors of the subject matter described herein have recognized that the functionality of registration can be applied to automatically locate features in a structure. However, unlike applications such as machine vision, feature matching presents the unique challenge of matching part of a contiguous target set to a source set of points where there may be no straightforward way to segment the data set a-priori.

The above mentioned challenges are resolved in the various inventive embodiments, such as that shown in FIG. 1 which, in one respect, is a flowchart of actions of a structural feature identifier consistent with the invention. In other respects, the blocks depicted in FIG. 1 can also be considered to represent means 100 (e.g., hardwired or programmable circuitry or other processing means) for carrying out the described actions.

In an aspect of embodiments consistent with the invention, the process of recognizing features in an engineering model or structure and applying relevant rules to the onward computational process is uniquely based on points rather than any higher-order definition (such as CAD or imagery). This is because point clouds are a generic data representation that allows information about volumes (rather than surfaces) and measured (rather than computational) data values to be input to a single process without the need for specific data/file formats and without the need for representation types that are not suited to the data being represented—for example surface tufting on a 737 flight test. Therefore, one step is obtaining a point cloud representation of the structure (step 101).

Some, but not necessarily all, embodiments may further include the in-situ conversion of any other data representation to point clouds before global registration against the additional rule library is performed. This is unlike the geometry-based approaches, where rules are associated with named and tagged geometry (surfaces) before any discretization. This makes the current process ideally suited to the processing of computational engineering data sources based on product shape, regardless of representation. Accordingly, the step of obtaining the point cloud representation of the structure may need to include additional conversion steps. This is illustrated in FIG. 2, which, in one respect, is a flowchart of actions associated with step/element 101.

Figure 2:
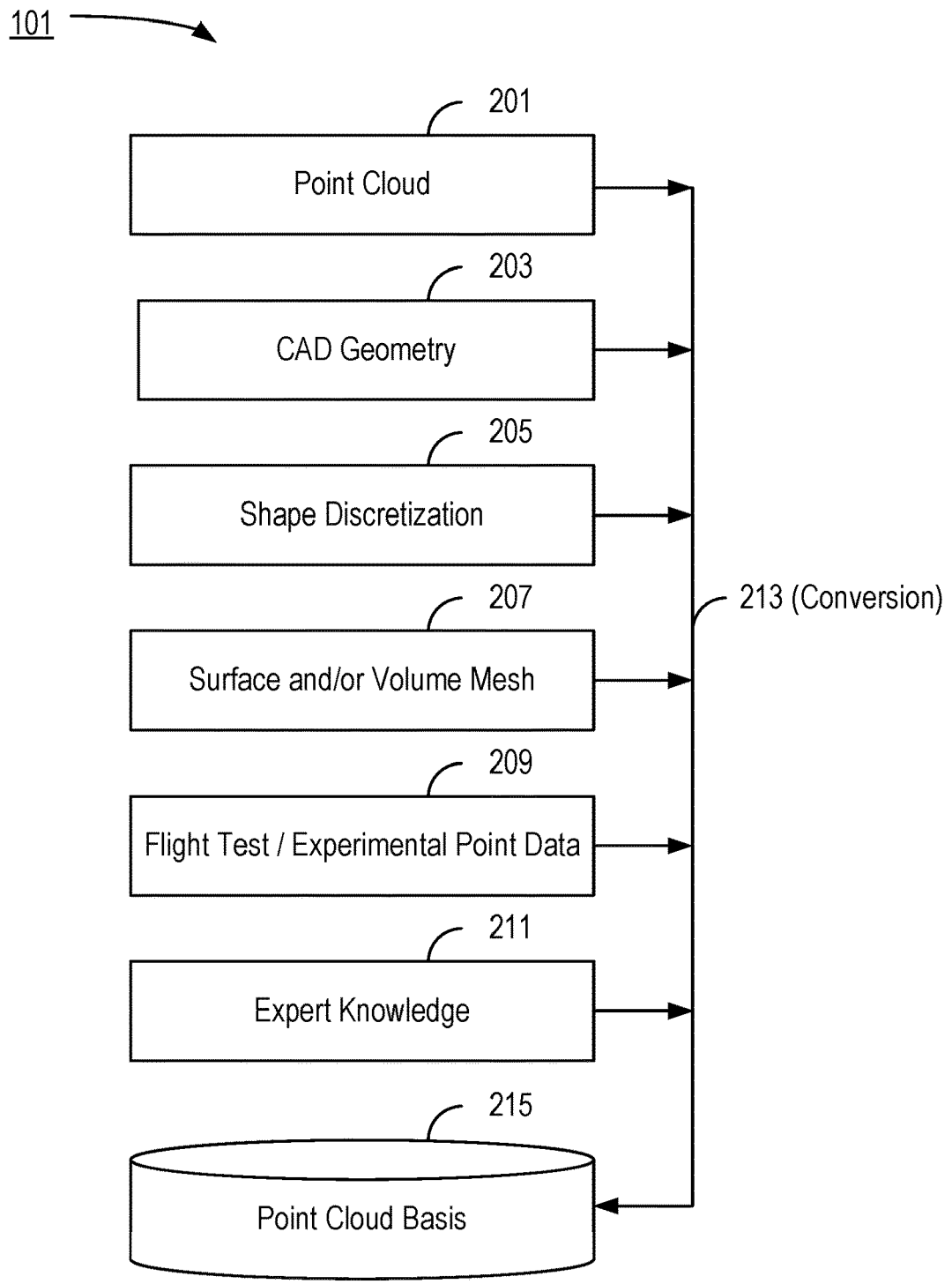
FIG. 2 is a flowchart of actions associated with a step/element that obtains a point cloud representation of a structure.

As shown in FIG. 2, the workspace can include data sources from any one or more of:
 i. Point Clouds 201,
 ii. CAD Geometry 203,
 iii. Shape Discretization 205,
 iv. Computational Surface and/or Volume Meshing 207,
 v. Flight Test Sensor Data and Data obtained through Physical Experiment 209,
 vi. Sensor data collected during a physical test of the structure (e.g., full scale or model),
 vii. Expert Knowledge 211 encoded in tables, text or imagery or input via a software GUI.

Valuable information relevant to computational engineering can be obtained from physical experiments using real-world structures relating to computationally designed structures. In such cases, the data from physical experiments may be from any one or more of: electronic sensors, direct measurements that are transcribed, photography with interpretation, and other forms of data capture. Examples of electronic sensors include, but are not limited to, electro-optic, pressure gauge, thermal, infra-red, accelerometer, acoustic (microphone), and strain gauge sensors.

In each case, data points with values of interest are generated. Conversion to point cloud format is straightforward as the data points and values require no additional structure.

Except for the case in which data originates as a point cloud 201, the remaining formats are first converted into point cloud representation (step 213) before all data is collected as a single point cloud dataset 215.

Referring back to FIG. 1, an optional next step is downsampling the point cloud dataset 215. This reduces the amount of data that needs to be processed, which in turn speeds up processing. To ease the description, as used herein, references to the "point cloud dataset" refer to the original dataset of step 101 if optional down-sampling 103 has been omitted in a given embodiment, and instead refer to the down-sampled point cloud dataset when optional down-sampling 103 has been performed.

An optional next step is feature point extraction (step 105), in which the point cloud dataset is processed to produce data representing one or more extracted features that characterize the local geometry around one or more points in the point cloud dataset, where the extracted features are preferably pose invariant with good discriminative power. Algorithms for performing suitable feature point extraction, such as Point Feature Histogram (PFH) and Fast Point Feature Histogram (FPFH) are known in the art, as exemplified by Rusu et al., "Fast Point Feature Histograms (FPFH) for 3D Registration", 2009 IEEE International Conference on Robotics and Automation, 2009, pp. 3212-3217, doi: 10.1109/ROBOT.2009.5152473. Accordingly, a thorough description of such algorithms is beyond the scope of this disclosure.

Next, in step 107, a target point cloud is obtained. The target point cloud is a subset of the global point cloud representation and represents a structural feature of interest (e.g., to a designer of the structure). The target point cloud may be supplied by a user of the inventive technology, or by an Artificial Intelligence (AI) that has been trained to automatically identify types of features that are of interest.

As one goal of the design process is to generate suitable meshes for each structural feature of interest, wherein the meshes are not represented in the original global point cloud (e.g., in the examples presented herein, meshes that define vortexes generated by vortex generators), another step is obtaining a rule that describes the mesh that is to be generated for the target point cloud (step 109), taking into account contextual information related to the locale of the target point cloud. It is noted that a mesh for a target point cloud may be at the location of the target point cloud but is not required to be. To take one, non-limiting example, if the target point cloud represents a vortex generator, the required area of mesh refinement will be downstream of the vortex generator itself. As with the data representing the structure, rules may be initially represented in any data source.

Rules for computational engineering processes can be linked to specific features in the point cloud representation of products and associated data sources, but the rules themselves need not be in point cloud representation. An example is mesh generation for aerodynamics where certain aircraft body parts require special treatment—normally input by an expert or via feedback from a downstream process. After matching point clouds corresponding to additional instances of target structural features of interest are identified at different locations on the aircraft body (or more generally, to whatever type of structure is being designed), the computational engineering rules are applied at the feature locations, with a transformation in space according to the registration transformation, in order to generate appropriate meshes associated with the identified features.

As mentioned earlier, registration is a process in which separate datasets, having different coordinate systems, can be aligned to a common coordinate system, such as in image processing applications. The inventors have recognized that the finding of a point of alignment can also be useful in a computational engineering environment for indicating when a subset of points in a point cloud match those of a known feature, and for that reason, next steps include performance of a global registration that seeks to find a match between each target point cloud and the extracted features (or more generally, of the global point cloud in embodiments that do not incorporate feature extraction).

To perform this quickly, it is advantageous to first perform a global registration of the target point cloud with the global point cloud (step 111), and then to refine the initial feature alignment by performing a local registration of the target point cloud with the globally registered point cloud (using a different algorithm) (step 113). The output of the local registration is a set of one or more matching point clouds, corresponding to features of interest on the structure that match the target point cloud. Accordingly, in the exemplary embodiment, the first registration procedure can be, for example, a RANdom SAmple Consensus (RANSAC) process or similar. Global registration processes are known generally, outside the context of the herein-described inventive embodiments (e.g., for alignment of images of 3-dimensional (3D) shapes for the purpose of creating a single 3D image from separate images). See, for example, Zhou et al., "Fast Global Registration", 9906. 10.1007/978-3-319-46475-6_47 (2016).

The local registration process can be, for example, an Iterative Closest Point (ICP) process or similar. The use of ICP for use outside the context of the herein-described inventive embodiments (e.g., for alignment of images of 3D shapes for the purpose of creating a single 3D image from separate images) is generally known in the art. See, for example, Gelfand et al., "Robust Global Registration", SGP05: Eurographics Symposium on Geometry Processing, The Eurographics Association pp. 197-206 (2005).

A benefit of the strategy in which global registration and local registration are performed in sequence is that the global registration of the target point cloud with the global point cloud conditions the point cloud data such that points are clustered around potential features of interest in the structure. This clustering has the effect of creating a subset of points for the local registration to consider, thereby enabling the local registration process to work satisfactorily. Otherwise, local registration by itself would be ineffective.

To ensure accuracy in the exemplary embodiment, a measure of registration fitness is produced for each of the matching point clouds identified by the registration processes. This can be done by, for example, producing a fitness estimate representing a distance between the target point cloud and each automatically identified matching point cloud (step 115). The measure of fitness can be, for example, a Root Mean Square Error (RMSE) value.

The measure of fitness of the matching point cloud is compared with a threshold value (representing a minimum acceptable level of fitness), and if the fitness of an identified matching point cloud satisfies the comparison ("Yes" path out of decision block 117), the identified matching point cloud and contextual information describing its associated locale are stored or otherwise made available to a designer (step 119).

Having identified matching point clouds of the target point cloud within the global point cloud, corresponding meshes for those matching point clouds are generated. Doing so requires that the rules for mesh generation take into consideration the context of those matching point clouds in relation to the context of the locale in which the target point cloud is situated (e.g., the pose and surrounding elements of each given point cloud), since the newly generated mesh should fit within the context of the matching point cloud's locale. Rules for generating computational engineering meshes at the locations of the identified matching point clouds are created by adapting/transforming the rules associated with the target point cloud (step 121) based on the relation between the locale of the target point cloud and that of the matching point cloud. The transformed rules are then applied to generate respective meshes for each matching point cloud (step 121).

Figure 3:
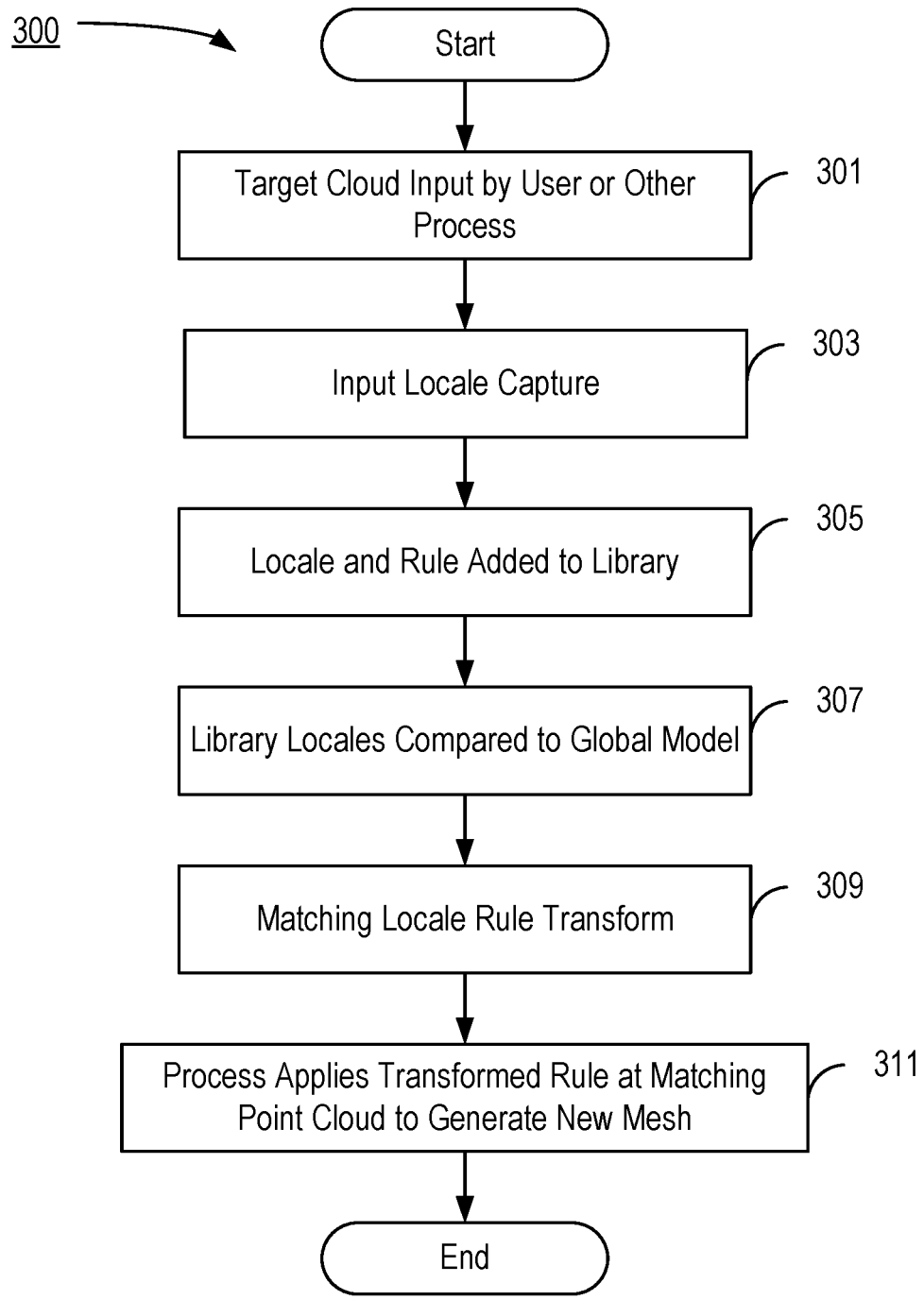
FIG. 3 is, in one respect, a flowchart of some actions of a structural feature recognizer in accordance with some embodiments consistent with the invention.
Figure 4:
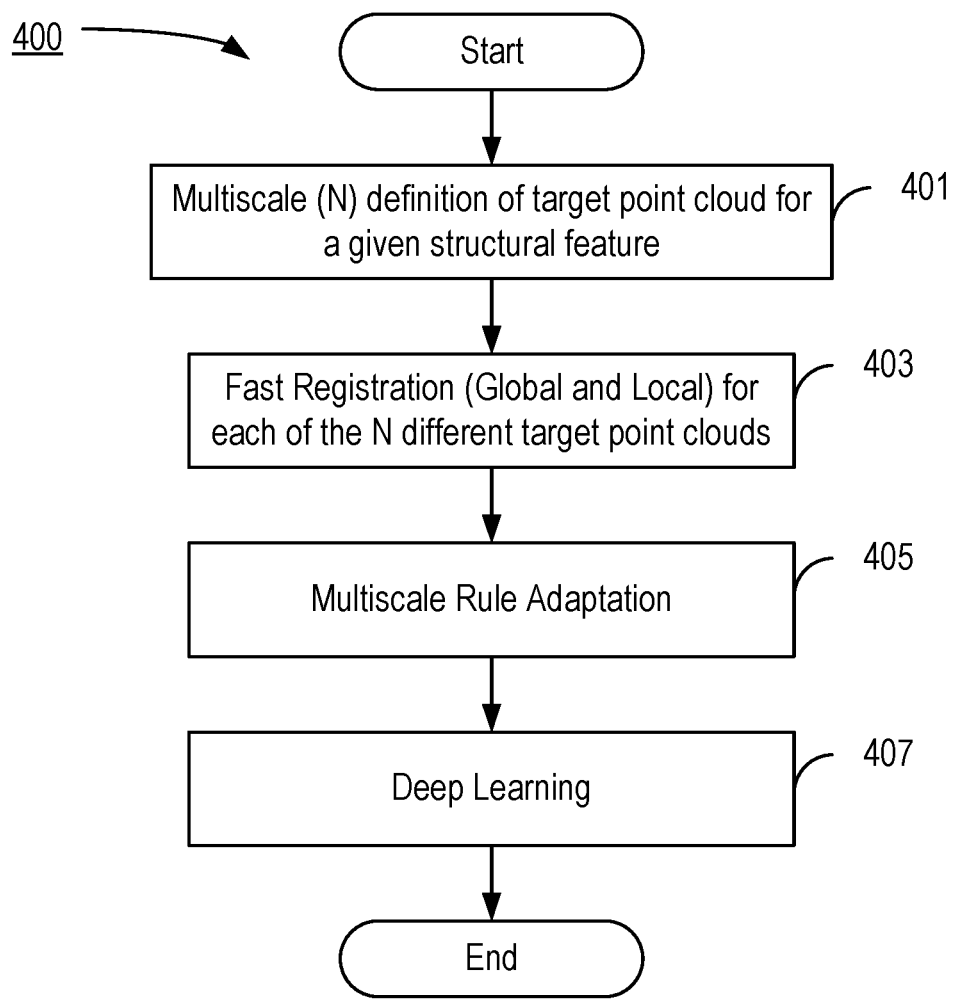
FIG. 4 is, in one respect, a flowchart of some actions of a structural feature recognizer in accordance with some embodiments consistent with the invention.

An exemplary embodiment involving the locale-dependent rule transformation of step 121 is illustrated in FIG. 3 which, in one respect, is a flowchart of actions of a structural feature identifier consistent with the invention. In other respects, the blocks depicted in FIG. 3 can also be considered to represent means 300 (e.g., hardwired or programmable circuitry or other processing means) for carrying out the described actions. Actions involved in this aspect include:

Input of a target point cloud by a user or a downstream process (step 301).
Input of locale capture (step 303), which serves as the reference context against which the contexts (locales) of matching point clouds are compared.
Adding the locale and rule to a library (step 305).
Comparing library locales to a global model (step 307). This is described further in connection with FIG. 4.
Transforming rules of matching locales based on the comparison of library locales to the locales of the matching point clouds (step 309).
Applying transformed rules to generate meshes at identified matching point clouds (step 311).

Referring back to decision block 117 in FIG. 1, if the fitness of an identified matching point cloud does not satisfy the comparison with the threshold level of fitness ("No" path out of decision block 117), the identified matching point cloud is not considered further.

Further aspects of some but not necessarily all inventive embodiments involve multiscale registration, which is advantageous in use cases in which the details of the mesh generation rules to be applied for an identified feature are not the same at different locales. For example, the same vortex generator shape may require a longer downstream volume of mesh refinement when located on the leading edge of a wing than when located near the windscreen of an aircraft. Considering this aspect in further detail, it will be appreciated that the use of deep learning algorithms for multi scale registration (matching point clouds and locales) requires the automatic generation of recognizable patterns of points at multiple length scales determined from the global model. For example, if one looks at the surface of a sphere at very small distance from the surface, the shape appears to be flat; if the entire sphere is viewed, then one sees a set of points equidistant from a central point; and if one moves very far away, then one sees just a single point. For an aircraft, if one considers a vortex generator near the nose of the aircraft one sees a vortex generator on a flat surface; or a vortex generator on a cylinder; or a vortex generator just in front of a flat surface (the window of the aircraft); or a vortex generator near the front of a long cylindrical body, all depending on the distance of the observation point relative to the structure (or equivalently, depending on the size of the point cloud under consideration). For the same vortex generator at the rear of the aircraft near the tail, one sees a vortex generator on a flat surface; or a vortex generator on a cylinder; or a vortex generator near a large vertical lifting surface (the tail) and a large horizontal lifting surface (the horizontal stabilizer); or critically a vortex generator near the rear of a large cylinder—where the fluid dynamic boundary layer is considerably thicker than at the front of the aircraft. Again, what one sees is dependent on the size of the point cloud under consideration.

In view of the above, in another aspect of some but not necessarily all inventive embodiments, it is often advantageous in the computational engineering design process to automatically represent the global point cloud at (N) multiple useful length scales, with associated library entries as multiscale segmentation, where each scale acts as a modifier to the base rule library. To illustrate this aspect, reference is made to FIG. 4 which, in one respect, is a flowchart of actions of a computational engineering design tool consistent with the invention. In other respects, the blocks depicted in FIG. 4 can also be considered to represent means 400 (e.g., hardwired or programmable circuitry or other processing means) for carrying out the described actions. Actions involved in this aspect include:

Multiscale definitions of the target point cloud for a given structure feature (produces N differently sized/scaled target point clouds for a given structural feature) (step 401). The choice of the different scales can by input by a user or can be automatically generated via deep learning technology.
Perform fast registration (e.g., global registration followed by local registration as illustrated by steps 111 and 113 of FIG. 1) for each of the N different target point clouds (step 403). Some matching point clouds may be identified in more than one of the N executions of fast registration, and others may be present in only one, all depending on what the feature is and how similar or dissimilar the related feature locales are from one another at different scales.
Multiscale rule adaptation (step 405) to produce rules that are appropriate for each respective one of the N differently sized point clouds.
Deep learning (step 407).

Figure 5:
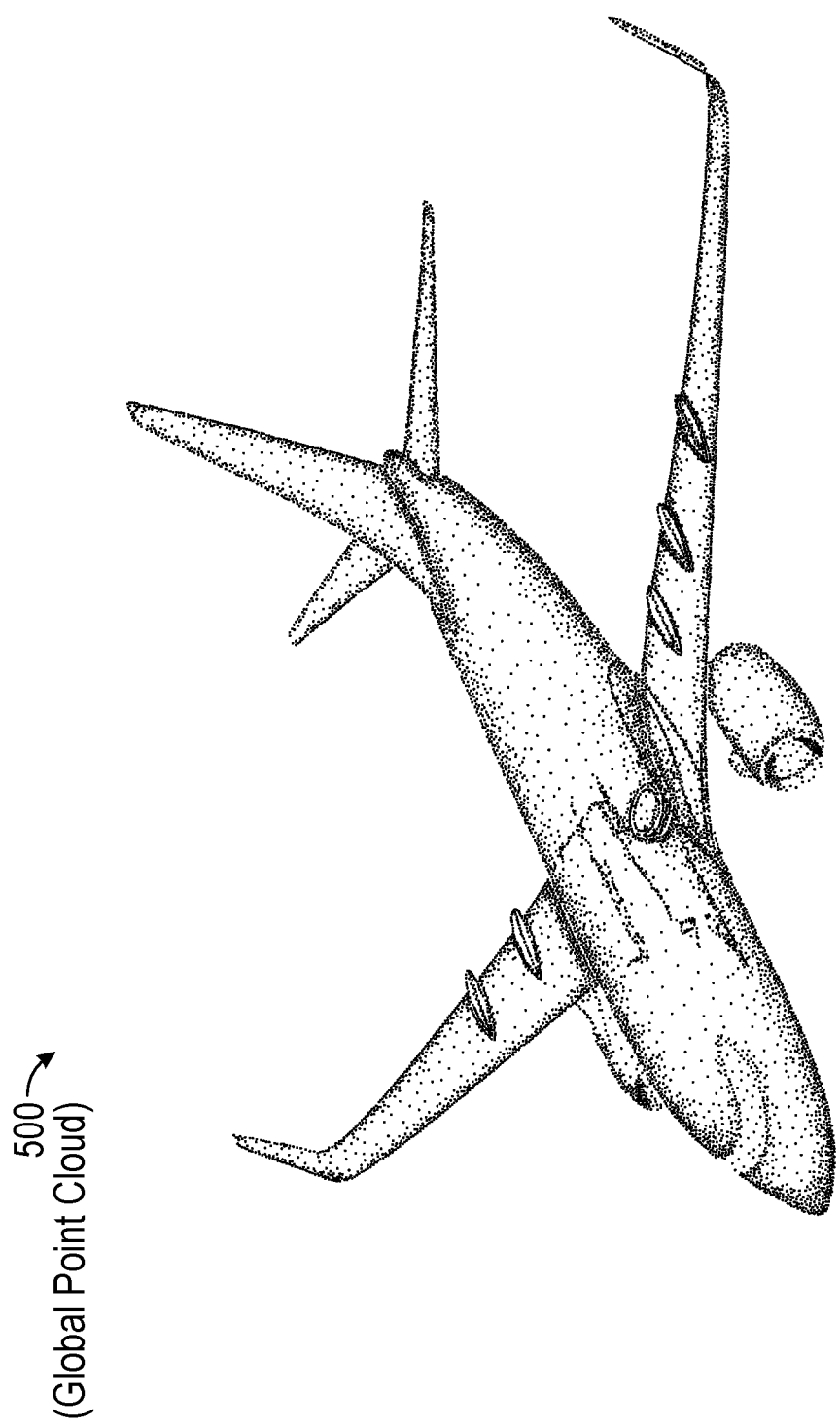
FIG. 5 is a point cloud representation of an exemplary aircraft.

Further aspects of embodiments consistent with the invention are now described in the context of a non-limiting example. FIG. 5 is a global point cloud representation of an aircraft 500 (in this case, a Boeing 737). In this example, it is desired to identify the ten independent counter-rotating vortex generator pairs at the front of the aircraft 500, given just one of these pairs. The vortex generator pair therefore serves as the structural feature discussed above.

To identify vortex generators in this design, an initial step is obtaining a good quality digital geometry definition (such as CAD) that represents the shape of the object to be studied to sufficient accuracy. In this case, the geometry is a CAD representation of the aircraft 500.

In order to represent the shape as a point cloud, a basic mesh is produced by sampling the geometry with an octree (or other suitable discretization), which produces a large number of points. For this particular aircraft, the global point cloud 500 contains approximately 1 million surface points.

Figure 6:
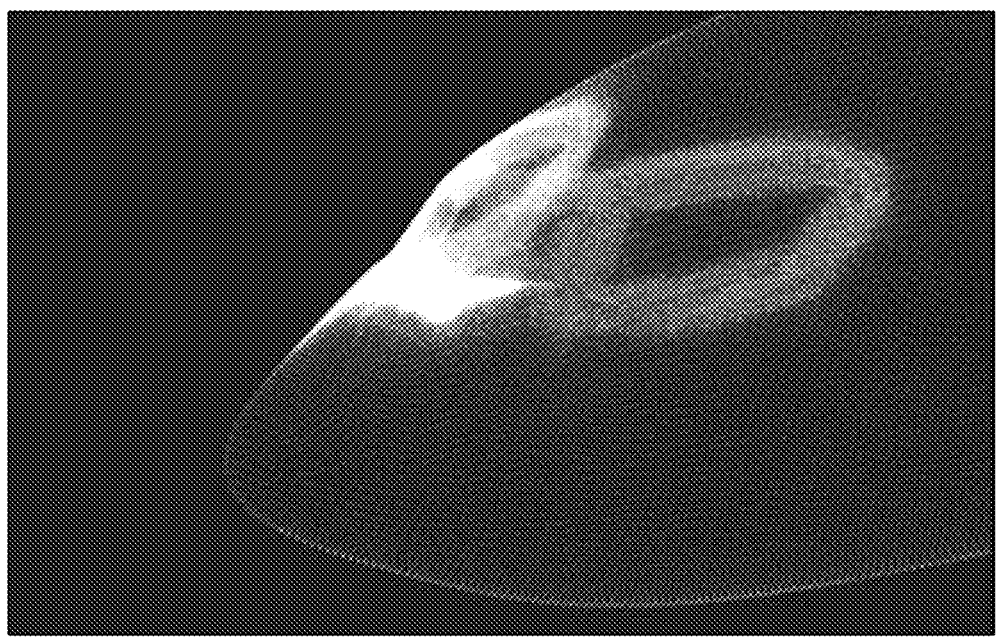
FIG. 6 shows a computer-generated image of the nose section of the aircraft of FIG. 5.
Figure 6:
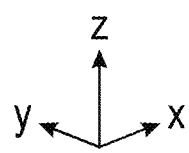

FIG. 6 shows a computer-generated image of the nose section 600 of the aircraft's global point cloud 500. It can be seen that the point cloud is already clustered around areas with small features or high curvature.

Figure 7A:
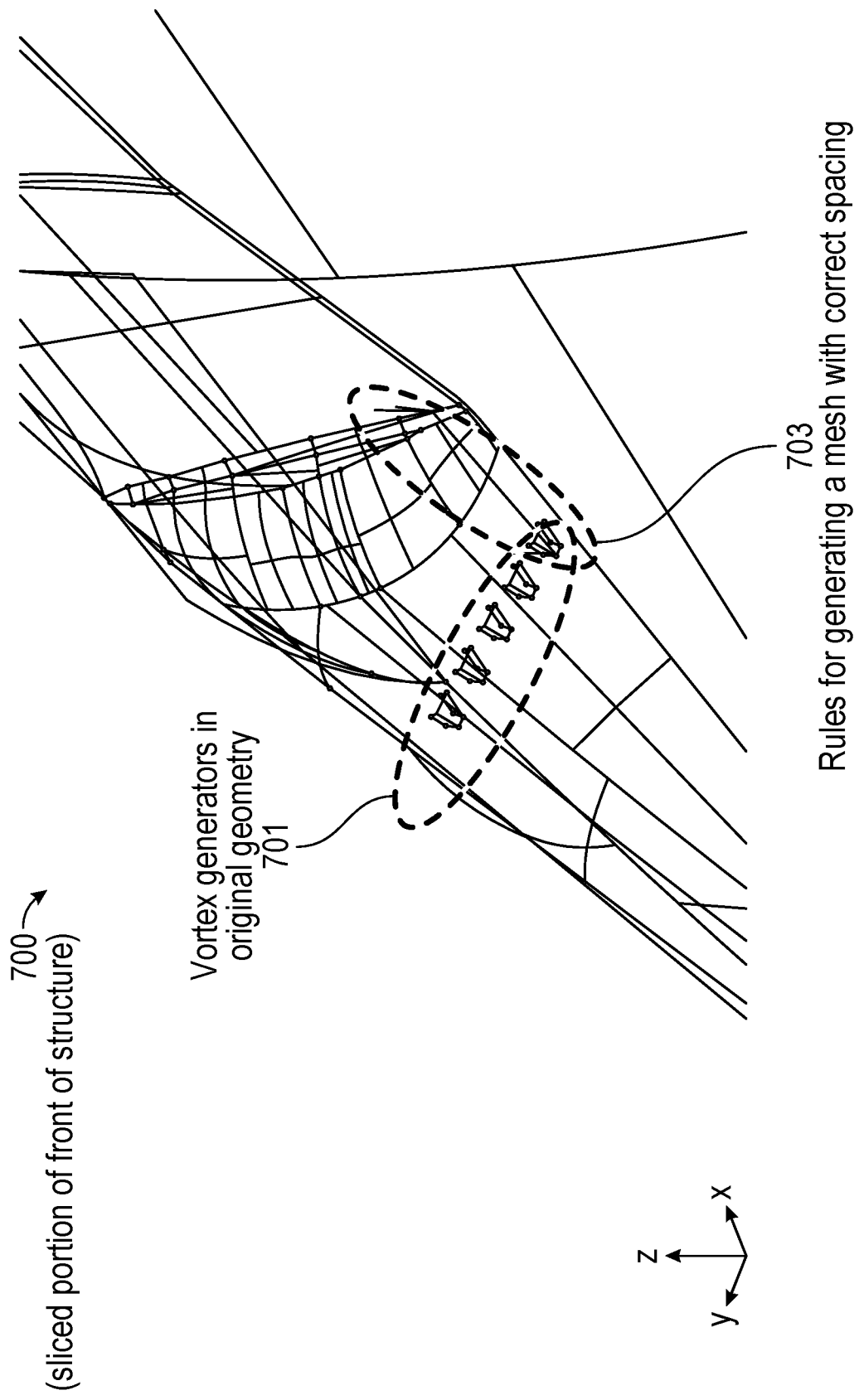
FIGS. 7A, 7B, 7C, 7D, and 7E illustrate aspects of feature identification and mesh generation in accordance with inventive embodiments.

FIGS. 7A, 7B, 7C, 7D, and 7E illustrate aspects of feature identification and mesh generation. Referring first to FIG. 7A (to simplify the figure, the fuselage has been sliced down a center line extending from front to back of the aircraft and only one slice is shown in the figure), the basic rules (feature size, surface curvature) do not completely define the required mesh spacing. To address this problem, one of the vortex generators 701 (the target structural feature) is identified in the original geometry (e.g., by an expert user). The expert user then adds in a set of rules 703 for generating a mesh with the correct spacing given the locale of the target feature. An expert will use a "sourcing rule" to add in more information before the final mesh is produced.

Figure 7B:
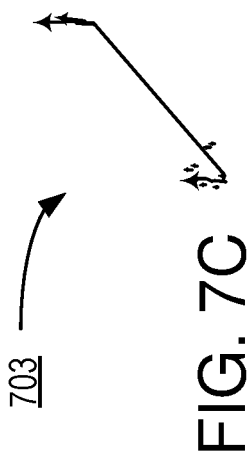
Figure 7D:
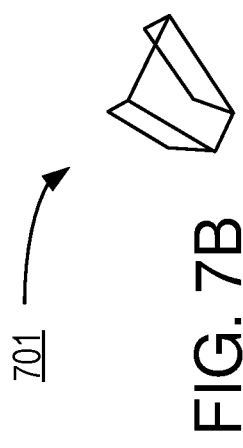
Figure 7C:
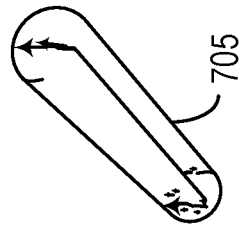
Figure 7E:
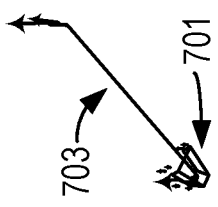

FIG. 7A illustrates the vortex generators 701 and the rules 703 for generating the mesh in context (i.e., as they are positioned in the nose section 600 of the aircraft's global point cloud 500). For the sake of clarity, FIG. 7B is an enlarged, isolated illustration of one of the vortex generators 701; FIG. 7C is an isolated illustration of the rules 703 for generating the mesh; FIG. 7D is an isolated illustration of the rules 703 for generating the mesh, in its placement relative to one of the vortex generators 701; and FIG. 7E illustrates a mesh 705 generated from the rule when applied in context at the location of the target vortex generator.

Figure 8:
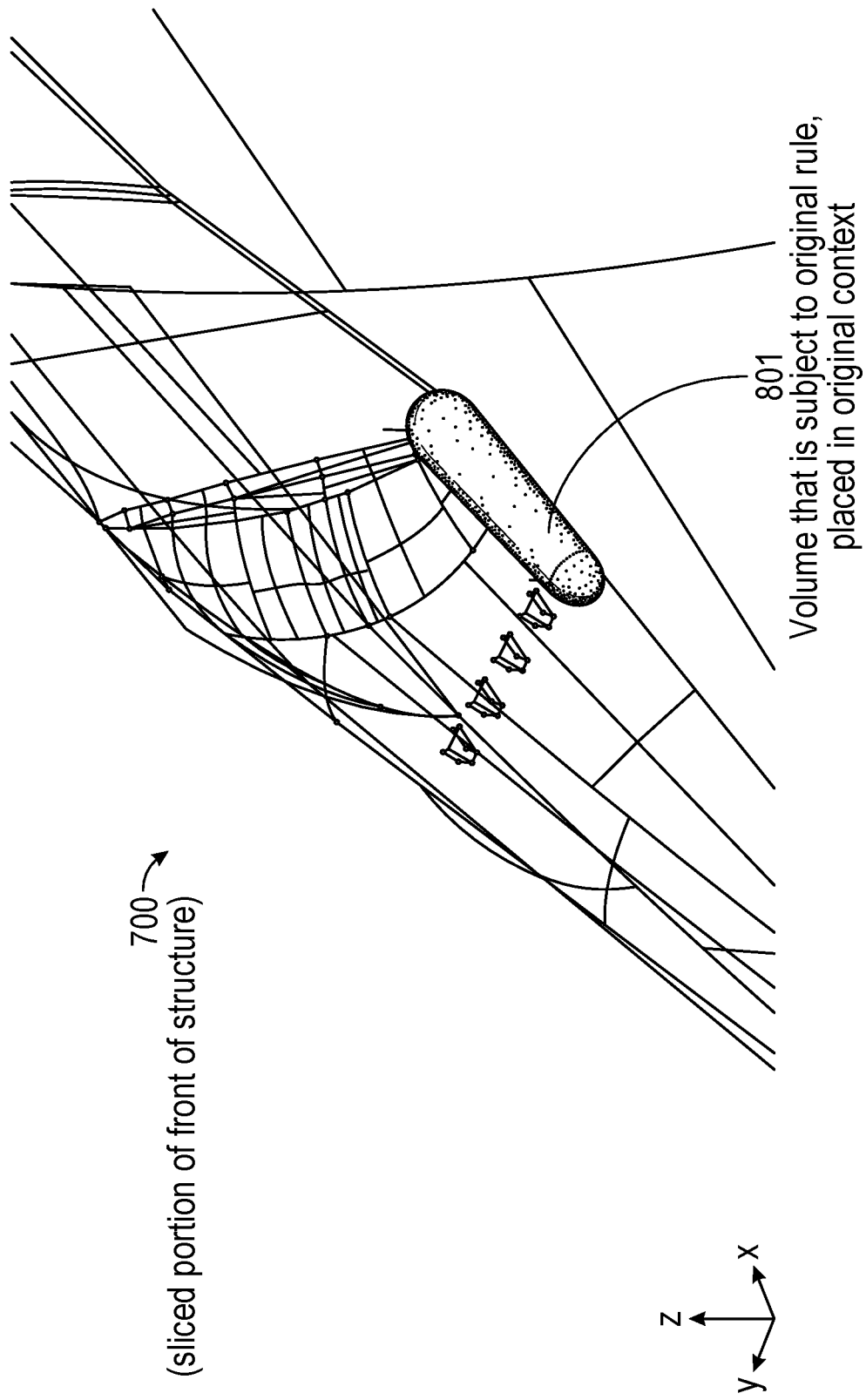
FIG. 8 illustrates the extent of a volume that is subject to the new rule in accordance with aspects of some inventive embodiments.

FIG. 8 illustrates the extent of a volume 801 that is subject to the new rule when placed in context on the structure.

Figure 9:
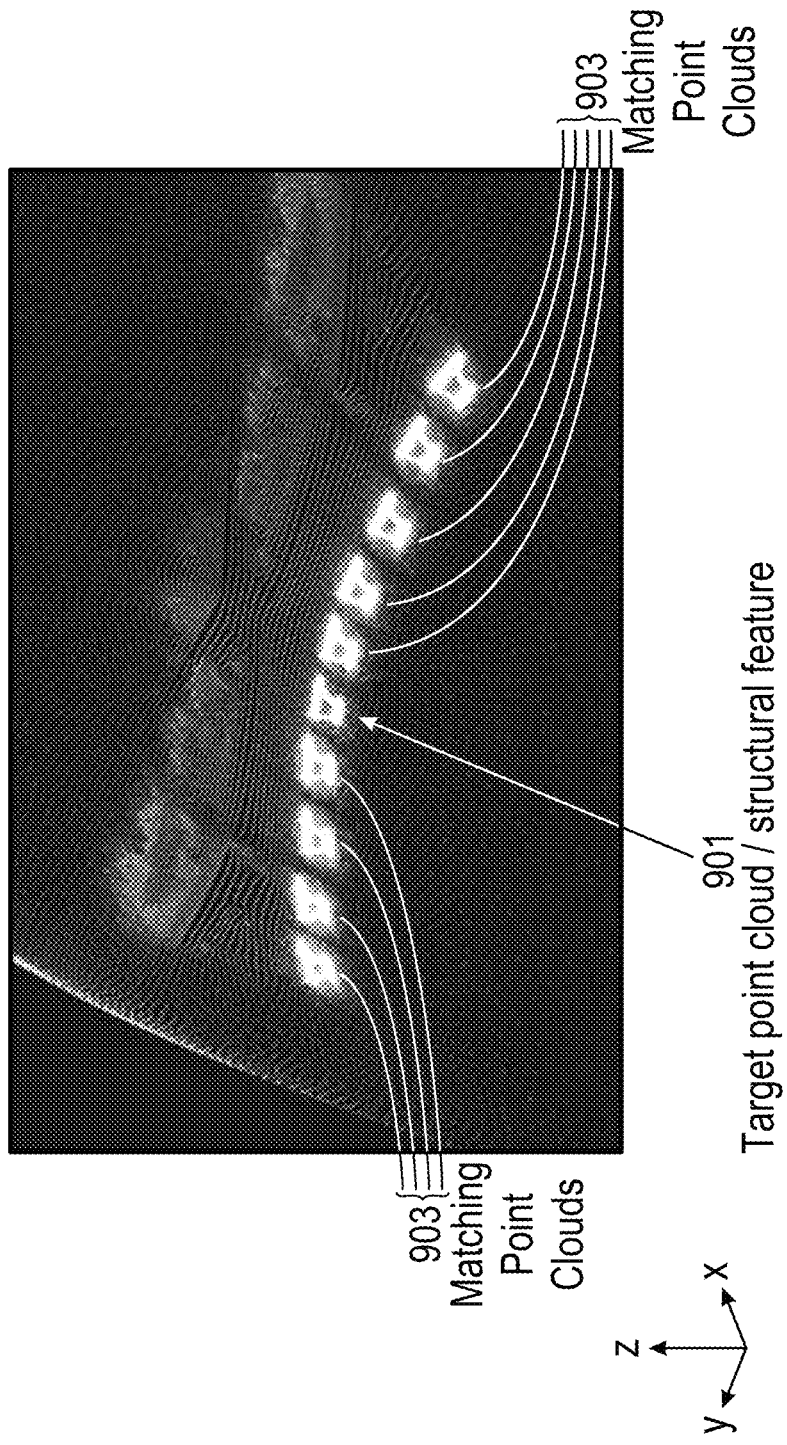
FIG. 9 illustrates a target structural feature and nine other vortex generators automatically identified by an exemplary embodiment of the invention.

Referring now to FIG. 9, in an aspect of inventive embodiments, the technology eliminates the need for an expert to repeat the process of rule specification for each of the ten vortex generator pairs. Instead, the inventive embodiments start with a target point cloud 901 (corresponding to a target structural feature of interest) and apply fast feature recognition as described above to find the same shapes in the rest of the volume, given its point cloud representation. In particular, FIG. 9 illustrates this aspect, showing a target point cloud 901 (in this example, a vortex generator represented by approximately 3000 points) and nine other automatically identified matching point clouds 903 that similarly correspond to vortex generators.

Figure 10:
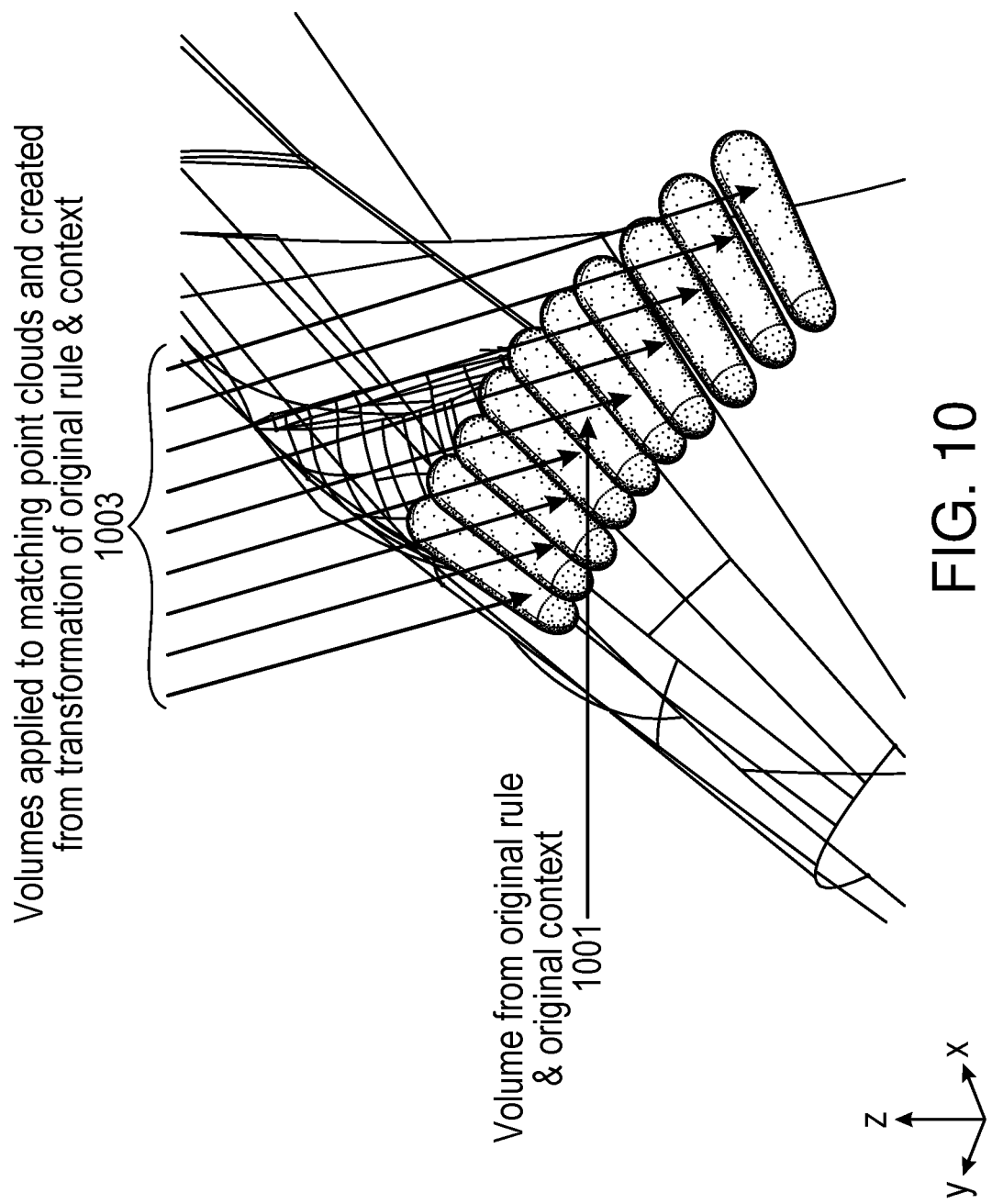
FIG. 10 illustrates how an original rule is automatically copied to produce copied volumes at other matching locations.

The rules exist as a set of points which are used to define the mesh spacing. Once a target set of point cloud matches is found for the original vortex generator, the mesh generation rules are transposed to the new location(s). FIG. 10 illustrates this aspect, depicting an original volume 1001 generated from an original rule, and showing how the original rule is automatically transformed (e.g., scaling and reorientation) and applied to the matching point clouds 903 to produce cloned volumes 1003 at the other nine matching locations.

In other aspects of some but not necessarily all embodiments consistent with the invention, the rules specified for each structural feature (e.g., in this example, a vortex generator) are used to determine the level of mesh refinement (spacing) nearby. Where the initial rules have been specified a-priori, the downstream use of the resulting mesh may confirm or contradict the need for such a spacing. For example, the spacing may be overly cautious (refined). In such cases, the gradients in the resulting flow solution would have been captured by a less refined (i.e., coarser) mesh. The associated rule can then be automatically modified so as to maintain solution accuracy with a better optimized spacing.

The best rules for any given identified feature may depend upon the feature context, and in some but not necessarily all embodiments, the rules are modified based on context. Contextual information includes:

1. The purpose of the model. For example the accuracy requirements for drag are more demanding on solution accuracy than are those for lift.
2. The surrounding geometry. For example a vortex generator on the leading edge of a wing will require a different downstream mesh refinement to maintain appropriate solution accuracy when compared with the same vortex generator located near the front windscreen. This will use a larger domain surrounding the target point cloud, sampled with a larger voxel size for the feature points. Thus the geometric context of vortex generators on the leading edge will all be similar to each other, but quite different from the nose of the aircraft. Each context would require its own rule modification.

In yet another aspect of some but not necessarily all inventive embodiments, data sources external to the computational fluid dynamics (CFD) process can also be used to modify the rules. For example, measurements of the flow on a real aircraft (pressure taps, tufting, oil scar photography) can establish the need for modified spacing rules when the measured data is made available in point cloud format.

Further aspects of some but not necessarily all inventive embodiments will be appreciated from the following program code (written in the Python programming language), which shows exactly how to identify the ten independent antisympathetic vortex generator pairs at the front of the aircraft's global point cloud 500 of FIG. 5, given just one of these pairs. This serves as a non-limiting example from which the person of ordinary skill in the art will gain further insight into how to make and use embodiments consistent with the invention.

```
import open3d as o3d
import numpy as np
import copy
import pypcd
import pandas as pd
import time
import os.path
import math
import copy
def writePCD(file):
    data = pd.read_csv(file)
    cloud = np.array(data)
    X = cloud[:, 0]
    Y = cloud[:, 1]
    Z = cloud[:, 2]
    data = np.column_stack((X, Y, Z))
    new_cloud = pypcd.make_xyz_point_cloud(data)
```

```
      fileName = file[:-4] + ".pcd"
      new_cloud.save_pcd(fileName)
def writecsv(pc,fname):
    with open(fname,'w') as f:
        f.write('X,Y,Z\n')
        for p in pc.points:
            f.write(str(p[0]+','+str(p[1])+','+str(p[2]+'\n')
    print('wrote '+fname)
def preprocess_point_cloud(pcd, voxel_size):
    print(":: Downsample with a voxel size %.3f." % voxel_size)
    pcd_down = pcd.voxel_down_sample(voxel_size)
    radius_normal = voxel_size * 10
    print(":: Estimate normal with search radius %.3f." % radius_normal)
    pcd_down.estimate_normals(
        o3d.geometry.KDTreeSearchParamHybrid(radius=radius_normal, max_nn=60))
    radius_feature = 2 * radius_normal
    print(":: Compute FPFH feature with search radius %.3f." % radius_feature)
    pcd_fpfh = o3d.pipelines.registration.compute_fpfh_feature(
        pcd_down,
        o3d.geometry.KDTreeSearchParamHybrid(radius=radius_feature, max_nn=100))
    return pcd_down, pcd_fpfh
def prepare_dataset(voxel_size, source_path, target_path):
    pcd_name_source = source_path[:-4] + ".pcd"
    pcd_name_target = target_path[:-4] + ".pcd"
    if os.path.exists(pcd_name_source):
        print("Source PCD file already exists. Skip file type conversion.")
    else:
        writePCD(source_path)
    if os.path.exists(pcd_name_target):
        print("Target PCD file already exists. Skip file type conversion.")
    else:
        writePCD(target_path)
    source_raw = o3d.io.read_point_cloud(pcd_name_source)
    target_raw = o3d.io.read_point_cloud(pcd_name_target)
    source_down, source_fpfh = preprocess_point_cloud(source_raw, voxel_size)
    target_down, target_fpfh = preprocess_point_cloud(target_raw, voxel_size)
    return source_raw, target_raw, source_down, target_down, source_fpfh, target_fpfh
def execute_global_registration(source_down, target_down, source_fpfh,
                target_fpfh, voxel_size, matching_factor):
    distance_threshold = voxel_size * matching_factor
    result = o3d.pipelines.registration.registration_ransac_based_on_feature_matching(
        source_down, target_down, source_fpfh, target_fpfh, True, distance_threshold,
        o3d.pipelines.registration.TransformationEstimationPointToPoint(False), 4, [
            o3d.pipelines.registration.CorrespondenceCheckerBasedOnEdgeLength(0.80),
            o3d.pipelines.registration.CorrespondenceCheckerBasedOnDistance(
                distance_threshold)
        ], o3d.cpu.pybind.pipelines.registration.RANSACConvergenceCriteria(
            max_iteration=1000000,
            confidence=0.99)
    )
    return result
def refine_registration(source, target, source_fpfh, target_fpfh, voxel_size):
    distance_threshold = voxel_size * 0.8
    result = o3d.pipelines.registration.registration_icp(
        source, target, distance_threshold, result_ransac.transformation,
        o3d.pipelines.registration.TransformationEstimationPointToPoint(with_scaling=True),
        o3d.pipelines.registration.ICPConvergenceCriteria(max_iteration=100000,
                            relative_rmse=0.001,
                            relative_fitness=0.001))
    return result
def remove_matching_points(s,t,transformation_matrix):
    print(str(len(t.points))+' points in target')
    s_temp = copy.deepcopy(s)
    plist = s_temp.transform(transformation_matrix).get_oriented_bounding_box( ).\
        get_point_indices_within_bounding_box(t.points)
    print(str(len(plist))+' points identified for removal')
    t = t.select_by_index(plist,invert=True)
    print(str(len(t.points))+' remaining points')
    return(t)
def make_source(pos,rad,res,fname):
    sph = o3d.geometry.TriangleMesh.create_sphere(radius=rad,
                        resolution=res,
                        create_uv_map=False)
    sph = o3d.geometry.TriangleMesh.compute_triangle_normals(sph)
    o3d.io.write_triangle_mesh(fname,
                sph.translate((pos[0],pos[1],pos[2])),
                write_ascii=False,
                compressed=False,
                write_vertex_normals=False,
```

```
                write_vertex_colors=False,
                write_triangle_uvs=False,
                print_progress=False)
    print('wrote '+str(fname))
def readbac(fname):
    points=[ ]
    lines=[ ]
    triangles=[ ]
    quads=[ ]
    tets=[ ]
    hexes=[ ]
    with open(fname,'r') as f:
        for i in range(40):
            f.readline( )
        f.readline( ) # 'background sources...'
        [npts,nlines,ntris] = [int(c) for c in f.readline( ).split( )]
        f.readline( ) # 'The points'
        for i in range(npts):
            f.readline( ) # 'Point Source'
            points.append([f.readline( ).split( )],) # x,y,z,s,r1,r2
        print('read '+str(len(points))+' points')
        f.readline( ) # 'The lines'
        for i in range(nlines):
            f.readline( ) # 'Line Source'
            l1 = f.readline( ).split( ) # x,y,z,s,r1,r2,['A',factor]
            l2 = f.readline( ).split( ) # x,y,z,s,r1,r2
            lines.append([l1,l2],)
        print('read '+str(len(lines))+' lines')
        f.readline( ) # 'The triangles'
        for i in range(ntris):
            f.readline( ) # 'Triangle Source'
            l1 = f.readline( ).split( ) # x,y,z,s,r1,r2,['A',factor]
            l2 = f.readline( ).split( ) # x,y,z,s,r1,r2
            l3 = f.readline( ).split( ) # x,y,z,s,r1,r2
            triangles.append([l1,l2,l3],)
        print('read '+str(len(triangles))+' triangles')
        f.readline( ) # 'The quads (v1)'
        f.readline( ) # 'The tets'
        f.readline( ) # 'The hexes (v1)'
        return(points,lines,triangles,quads,tets,hexes)
def writebac(fname,points=[ ],lines=[ ],triangles=[ ],quads=[ ],tets=[ ],hexes=[ ]):
    with open(fname,'w') as f:
        f.write('Background file written by Open3D\n')
        f.write(' 8 6\n')
        xe,ye,ze,se = 1e6,1e6,1e6,1e4
        n = 1
        for zs in [-1,1]:
            for xs in [1,-1]:
                for ys in [-1,1]:
                    f.write(' '+str(n)+' '+str(xs*xe)+' '+str(ys*ye)+' '+str(zs*ze)+'\n')
                    f.write(' 1.0 0.0 0.0 '+str(se)+'\n')
                    f.write(' 0.0 1.0 0.0 '+str(se)+'\n')
                    f.write(' 0.0 0.0 1.0 '+str(se)+'\n')
                    n += 1
        f.write(' 1 1 2 4 8\n')
        f.write(' 2 1 2 8 6\n')
        f.write(' 3 1 6 8 5\n')
        f.write(' 4 2 3 4 7\n')
        f.write(' 5 2 7 4 8\n')
        f.write(' 6 2 1 8 6\n')
        f.write(' background sources...\n')
        f.write(' '+str(len(points))+' '+str(len(lines))+' '+str(len(triangles))+'\n')
        f.write(' The points\n')
        for i in range(len(points)):
            f.write('Point Source :\n')
            for j in range(len(points[i])): f.write((' '+str(points[i][j])))
            f.write('\n')
        f.write(' The lines\n')
        for i in range(len(lines)):
            f.write('Line Source :\n')
            for k in range(len(lines[i])):
                for j in range(len(lines[i][k])): f.write((''+str(lines[i][k][j])))
                f.write('\n')
        f.write(' The triangles\n')
        for i in range(len(triangles)):
            f.write('Triangle Source :\n')
            for k in range(len(triangles[i])):
                for j in range(len(triangles[i][k])): f.write((' '+str(triangles[i][k][j])))
                f.write('\n')
```

```
        f.write(' The quads (v1)\n')
        f.write(' The tets\n')
        f.write(' The hexes (v1)\n')
    print('wrote '+str(fname))
def transform_source(tmatrix,vec):
    new_point = np.asarray([float(vec[0]),float(vec[1]),float(vec[2]),1.0])
    new_point = (np.asarray(tmatrix).dot(new_point))
    return(list(new_point[:3]) + list(vec[3:]))
def transform_sources(tmatrix,points=[ ],lines=[ ],triangles=[ ],quads=[ ],tets=[ ],hexes=[ ]):
    new_points = copy.deepcopy(points)
    new_lines = copy.deepcopy(lines)
    new_triangles = copy.deepcopy(triangles)
    if (len(quads) > 0) or (len(tets)> 0) or (len(hexes)> 0):
        print('Transform not implemented')
        return 0
    for p in new_points:
        p = transform_source(tmatrix,p)
    for l in new_lines:
        for il in range(len(l)):
            l[il] = transform_source(tmatrix,l[il])
    for t in new_triangles:
        for it in range(len(t)):
            t[it] = transform_source(tmatrix,t[it])
    return(new_points,new_lines,new_triangles,quads,tets,hexes)
if __name__ == "__main__":
    root_path = 'data/'
    case = 3
    if case==1:
        source_path = root_path + "skyhunter_tip_trans.csv"
        target_path = root_path + "skyhunter_full.csv"
        voxel_size = 0.05 # means 5cm for the dataset.
        matching_factor = 3
        maxits = 5
    elif case==2:
        source_path = root_path + "vg.csv"
        target_path = root_path + "737.csv"
        voxel_size = 0.002
        matching_factor = 1
        maxits = 10
    elif case==3:
        source_path = root_path + "vg_inches.csv"
        target_path = root_path + "737_nose_inches.csv"
        voxel_size = 0.002*39.3701 # scale to inches
        matching_factor = 1
        maxits = 10
        points,lines,triangles,quads,tets,hexes = readbac('737_geom/vg.bac')
        points_all = [ ]
        lines_all = [ ]
        triangles_all = [ ]
        quads_all = [ ]
        tets_all = [ ]
        hexes_all = [ ]
    else:
        print('Case Not Recognised')
    start = time.time( )
    t_fpfh_0 = time.time( )
    source, target, source_down, target_down, source_fpfh, target_fpfh = \
        prepare_dataset(voxel_size, source_path, target_path)
    t_fpfh_1 = time.time( )
    make_source(source.get_center( ),
            max((source.get_max_bound( )[i]-source.get_min_bound( )[i] for i in range(3)), 20, 'data/source.stl')
    print('Initial FPFH calculation took: ' + str(t_fpfh_1 - t_fpfh_0) + ' seconds')
    registration_fitness = 1.0
    iteration = 0
    while registration_fitness > 0.1 and iteration < maxits:
        iteration += 1
        print('Iteration = ' +str(iteration))
        t_ransac_0 = time.time( )
        result_ransac = execute_global_registration(source_down, target_down, source_fpfh, target_fpfh, voxel_size, matching_factor)
        t_ransac_1 = time.time( )
        print('RANSAC took: ' + str(t_ransac_1 - t_ransac_0) + ' seconds')
        print(result_ransac)
        print(result_ransac.transformation)
        t_icp_0 = time.time( )
        result_icp = refine_registration(source, target, source_fpfh, target_fpfh, voxel_size)
        t_icp_1 = time.time( )
        print('ICP took: ' + str(t_icp_1 - t_icp_0) + ' seconds')
        print(result_icp)
        print(result_icp.transformation)
```

```
        points__2,lines__2,triangles__2,quads__2,tets__2,hexes__2 = \
        transform__sources(result__icp.transformation,points,lines,triangles,quads,tets,hexes)
        writebac('737__geom/vg__'+str(iteration).zfill(2)+'.bac',points__2,lines__2,triangles__2,quads__2,tets__2,hexes__2)
        points__all += copy.deepcopy(points__2)
        lines__all += copy.deepcopy(lines__2)
        triangles__all += copy.deepcopy(triangles__2)
        quads__all += copy.deepcopy(quads__2)
        tets__all += copy.deepcopy(tets__2)
        hexes__all += copy.deepcopy(hexes__2)
        end = time.time( )
        print('Registration took: ' + str(end − start) + ' seconds')
        target = remove__matching__points(source,target,result__ransac.transformation)
        registration__fitness = result__icp.fitness
        if registration__fitness > 0.1:
            writecsv(copy.deepcopy(source).transform(result__ransac.transformation), 'data/ransac__result__'+str(iteration)+'.csv')
            writecsv(copy.deepcopy(source).transform(result__icp.transformation), 'data/icp__result__'+str(iteration)+'.csv')
            writecsv(target, root__path +'remaining__points.csv')
        target__down, target__fpfh = preprocess__point__cloud(target, voxel__size)
        source__down, source__fpfh = preprocess__point__cloud(source, voxel__size)
        print(' ')
writebac('737__geom/vg__all.bac',points__all,lines__all,triangles__all,quads__all,tets__all,hexes__all)
```

Figure 11:
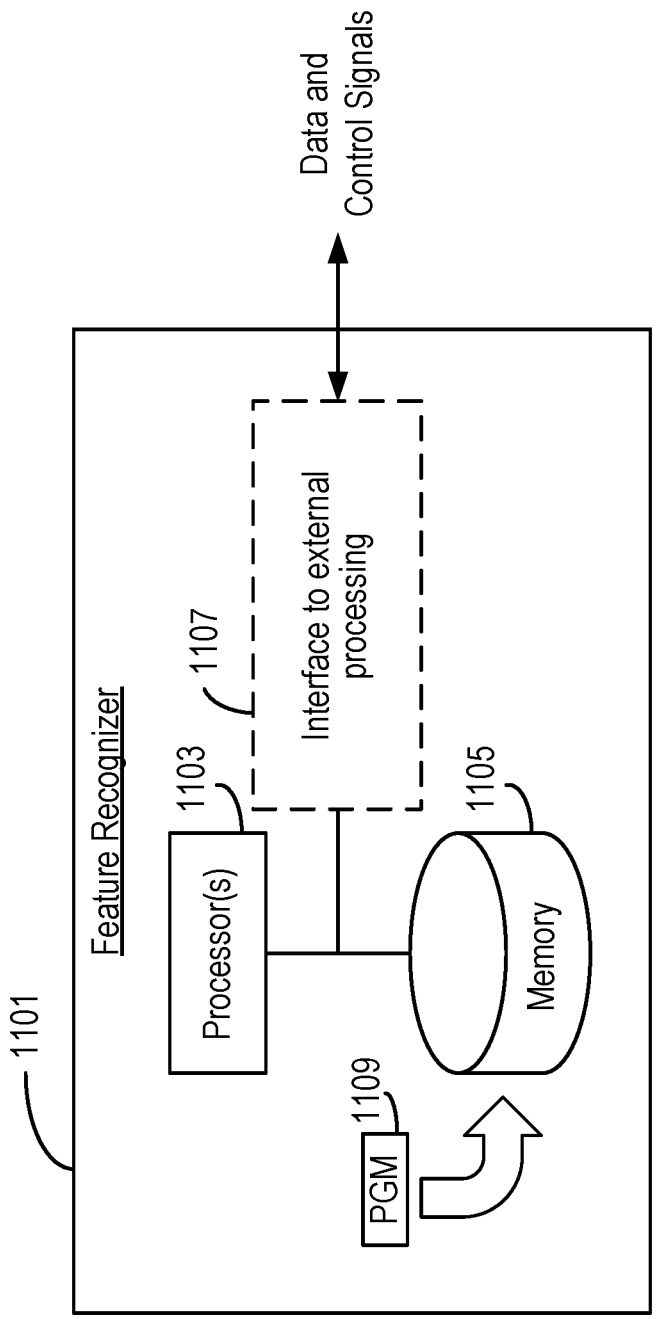
FIG. 11 shows an exemplary structural feature recognizer that is configured to cause any and/or all of the herein-described and illustrated actions to be performed.

Further aspects of embodiments consistent with the invention will now be described with reference to FIG. 11, which shows an exemplary structural feature recognizer and mesh generator 1101 that is configured to cause any and/or all of the herein-described and illustrated actions to be performed. In particular, the structural feature recognizer and mesh generator 1101 includes circuitry configured to carry out any one or any combination of the various functions described herein. Such circuitry could, for example, be entirely hard-wired circuitry (e.g., one or more Application Specific Integrated Circuits—"ASICs"). Depicted in the exemplary embodiment of FIG. 11, however, is programmable circuitry, comprising one or more processors 1103 coupled to one or more memory devices 1105 (e.g., Random Access Memory, Magnetic Disc Drives, Optical Disk Drives, Read Only Memory, etc.) and to an interface 1107 that enables bidirectional communication of data and/or control signals with other components (e.g., Input/Output devices) and in some but not necessarily all inventive embodiments, other processing resources that may carry out some of the processing described herein. A complete list of possible other elements is beyond the scope of this description.

The memory device(s) 1105 store program means 1109 (e.g., a set of processor instructions) configured to cause the one or more processors 1103 to control other device elements so as to carry out any of the aspects described herein. The memory device(s) 1105 may also store data (not shown) representing various constant and variable parameters as may be needed by the one or more processors 1103 and/or as may be generated when carrying out its functions such as those specified by the program means 1109.

The invention has been described with reference to particular embodiments. However, it will be readily apparent to those skilled in the art that, having learned and then applying aspects of the technology from this disclosure, it is possible to embody the invention in specific forms other than those of the embodiments described above. Thus, the described embodiments are merely illustrative and should not be considered restrictive in any way. The scope of the invention is further illustrated by the appended claims, rather than only by the preceding description, and all variations and equivalents which fall within the range of the claims are intended to be embraced therein.

What is claimed is:

1. A method of identifying a structural feature of a structure, the method comprising:
   obtaining a global point cloud representation of the structure;
   obtaining a target point cloud that represents a target structural feature, wherein the target point cloud is a subset of the global point cloud representation of the structure;
   supplying global structural information and the target point cloud to a global registration process and producing therefrom a globally registered representation of the structure, wherein the global structural information is derived from the global point cloud representation of the structure; and
   supplying the globally registered representation of the structure and the target point cloud to a local registration process and producing therefrom one or more matching point clouds, wherein each of the one or more matching point clouds is a subset of the global point cloud representation of the structure.

2. The method of claim 1, wherein the global structural information is the global point cloud representation of the structure.

3. The method of claim 1, comprising:
   producing a set of one or more extracted structural features based on the global point cloud representation of the structure, wherein each of the one or more extracted structural features is a pose invariant characterization of a local geometry around a point in the global point cloud representation of the structure,
   wherein the global structural information is the set of the one or more extracted structural features.

4. The method of claim 3, wherein producing the set of the one or more extracted structural features based on the global point cloud representation of the structure comprises:
   determining a Point Feature Histogram (PFH) based on the global point cloud representation of the structure.

5. The method of claim 3, wherein producing the set of the one or more extracted structural features based on the global point cloud representation of the structure comprises:
   determining a Fast Point Feature Histogram (FPFH) based on the global point cloud representation of the structure.

6. The method of claim 3, wherein producing the set of the one or more extracted structural features based on the global point cloud representation of the structure comprises:

downsampling the global point cloud representation of the structure to produce a downsampled global point cloud representation of the structure; and producing the set of the one or more extracted structural features from the downsampled global point cloud representation of the structure.

7. The method of claim 1, wherein producing the one or more matching point clouds comprises:

identifying a subset of a locally registered representation of the structure as one of the one or more matching point clouds when a comparison between the subset of the locally registered representation of the structure and the target structural feature produces a predefined comparison result.

8. The method of claim 7, wherein the predefined comparison result is a predefined root mean square error between the subset of the locally registered representation of the structure and the target structural feature.

9. The method of claim 1, wherein the global registration process is a RANdom SAmple Consensus (RANSAC) process.

10. The method of claim 1, wherein the local registration process comprises determining an Iterative Closest Point (ICP) value.

11. The method of claim 1, wherein obtaining the global point cloud representation of the structure comprises one or more of:

obtaining point cloud data by converting a CAD geometric representation of the structure;

obtaining point cloud data by converting a shape discretization representation of the structure;

obtaining point cloud data by converting a surface mesh representation of the structure;

obtaining point cloud data by converting a volume mesh representation of the structure;

obtaining point cloud data by converting sensor data collected during a flight test of the structure; and obtaining point cloud data by converting sensor data collected during a physical test of the structure.

12. The method of claim 1, comprising:

obtaining a rule that describes a volume associated with the target structural feature;

obtaining contextual information about a locale of the target structural feature; and producing, for each of the one or more matching point clouds, a corresponding volume having a mesh spacing, a size, and a pose, wherein:

the mesh spacing is produced in accordance with the rule; and the size and pose are each produced based on the contextual information about the locale of the target structural feature and on contextual information about a locale of said each of the one or more matching point clouds.

13. The method of claim 1, comprising:

obtaining one or more additional target point clouds that represent the target structural feature, wherein the one or more additional target point clouds are differently sized from one another and from the target point cloud;

for each of the one or more additional target point clouds, supplying the global structural information and said each of the one or more additional target point clouds to the global registration process and producing therefrom one or more additional globally registered representations of the structure; and for each of the one or more additional target point clouds, supplying the globally registered representation of the structure and said each of the one or more additional target point clouds to the local registration process and producing therefrom one or more additional sets of one or more matching point clouds.

14. The method of claim 1, wherein obtaining the global point cloud representation of the structure comprises:

obtaining point cloud data by converting a global non-point cloud representation of the structure into the global point cloud representation of the structure.

15. A nontransitory computer readable storage medium comprising program instructions that, when executed by one or more processors, carries out a method of identifying a structural feature of a structure, the method comprising:

obtaining a global point cloud representation of the structure;

obtaining a target point cloud that represents a target structural feature, wherein the target point cloud is a subset of the global point cloud representation of the structure;

supplying global structural information and the target point cloud to a global registration process and producing therefrom a globally registered representation of the structure, wherein the global structural information is derived from the global point cloud representation of the structure; and supplying the globally registered representation of the structure and the target point cloud to a local registration process and producing therefrom one or more matching point clouds, wherein each of the one or more matching point clouds is a subset of the global point cloud representation of the structure.

16. The nontransitory computer readable storage medium of claim 15, wherein the global structural information is the global point cloud representation of the structure.

17. The nontransitory computer readable storage medium of claim 15, comprising:

producing a set of one or more extracted structural features based on the global point cloud representation of the structure, wherein each of the one or more extracted structural features is a pose invariant characterization of a local geometry around a point in the global point cloud representation of the structure, wherein the global structural information is the set of the one or more extracted structural features.

18. The nontransitory computer readable storage medium of claim 17, wherein producing the set of the one or more extracted structural features based on the global point cloud representation of the structure comprises:

determining a Point Feature Histogram (PFH) based on the global point cloud representation of the structure.

19. The nontransitory computer readable storage medium of claim 17, wherein producing the set of the one or more extracted structural features based on the global point cloud representation of the structure comprises:

determining a Fast Point Feature Histogram (FPFH) based on the global point cloud representation of the structure.

20. The nontransitory computer readable storage medium of claim 17, comprising: wherein producing the set of the one or more extracted structural features based on the global point cloud representation of the structure comprises:
 downsampling the global point cloud representation of the structure to produce a downsampled global point cloud representation of the structure; and
 producing the set of the one or more extracted structural features from the downsampled global point cloud representation of the structure.

21. The nontransitory computer readable storage medium of claim 15, wherein producing the one or more matching point clouds comprises:
 identifying a subset of a locally registered representation of the structure as one of the one or more matching point clouds when a comparison between the subset of the locally registered representation of the structure and the target structural feature produces a predefined comparison result.

22. The nontransitory computer readable storage medium of claim 21, wherein the predefined comparison result is a predefined root mean square error between the subset of the locally registered representation of the structure and the target structural feature.

23. The nontransitory computer readable storage medium of claim 15, wherein the global registration process is a RANdom SAmple Consensus (RANSAC) process.

24. The nontransitory computer readable storage medium of claim 15, wherein the local registration process comprises determining an Iterative Closest Point (ICP) value.

25. The nontransitory computer readable storage medium of claim 15, wherein obtaining the global point cloud representation of the structure comprises one or more of:
 obtaining point cloud data by converting a CAD geometric representation of the structure;
 obtaining point cloud data by converting a shape discretization representation of the structure;
 obtaining point cloud data by converting a surface mesh representation of the structure;
 obtaining point cloud data by converting a volume mesh representation of the structure;
 obtaining point cloud data by converting sensor data collected during a flight test of the structure; and
 obtaining point cloud data by converting sensor data collected during a physical test of the structure.

26. The nontransitory computer readable storage medium of claim 15, comprising:
 obtaining a rule that describes a volume associated with the target structural feature;
 obtaining contextual information about a locale of the target structural feature; and
 producing, for each of the one or more matching point clouds, a corresponding volume having a mesh spacing, a size, and a pose,
 wherein:
  the mesh spacing is produced in accordance with the rule; and
  the size and pose are each produced based on the contextual information about the locale of the target structural feature and on contextual information about a locale of said each of the one or more matching point clouds.

27. The nontransitory computer readable storage medium of claim 15, comprising:
 obtaining one or more additional target point clouds that represent the target structural feature, wherein the one or more additional target point clouds are differently sized from one another and from the target point cloud;
 for each of the one or more additional target point clouds, supplying the global structural information and said each of the one or more additional target point clouds to the global registration process and producing therefrom one or more additional globally registered representations of the structure; and
 for each of the one or more additional target point clouds, supplying the globally registered representation of the structure and said each of the one or more additional target point clouds to the local registration process and producing therefrom one or more additional sets of one or more matching point clouds.

28. The nontransitory computer readable storage medium of claim 15, wherein obtaining the global point cloud representation of the structure comprises:
 obtaining point cloud data by converting a global non-point cloud representation of the structure into the global point cloud representation of the structure.

29. A system for identifying a structural feature of a structure, the system comprising:
 one or more nontransitory memories having stored therein program instructions; and
 one or more processors configured to execute the program instructions and thereby to perform:
 obtaining a global point cloud representation of the structure;
 obtaining a target point cloud that represents a target structural feature, wherein the target point cloud is a subset of the global point cloud representation of the structure;
 supplying global structural information and the target point cloud to a global registration process and producing therefrom a globally registered representation of the structure, wherein the global structural information is derived from the global point cloud representation of the structure; and
 supplying the globally registered representation of the structure and the target point cloud to a local registration process and producing therefrom one or more matching point clouds, wherein each of the one or more matching point clouds is a subset of the global point cloud representation of the structure.

30. The system of claim 29, wherein the global structural information is the global point cloud representation of the structure.

31. The system of claim 29, wherein the one or more processors are further configured to perform:
 producing a set of one or more extracted structural features based on the global point cloud representation of the structure, wherein each of the one or more extracted structural features is a pose invariant characterization of a local geometry around a point in the global point cloud representation of the structure,
 wherein the global structural information is the set of the one or more extracted structural features.

32. The system of claim 31, wherein producing the set of the one or more extracted structural features based on the global point cloud representation of the structure comprises:
 determining a Point Feature Histogram (PFH) based on the global point cloud representation of the structure.

33. The system of claim 31, wherein producing the set of the one or more extracted structural features based on the global point cloud representation of the structure comprises:

determining a Fast Point Feature Histogram (FPFH) based on the global point cloud representation of the structure.

34. The system of claim 31, wherein producing the set of the one or more extracted structural features based on the global point cloud representation of the structure comprises:
   downsampling the global point cloud representation of the structure to produce a downsampled global point cloud representation of the structure; and
   producing the set of the one or more extracted structural features from the downsampled global point cloud representation of the structure.

35. The system of claim 29, wherein producing the one or more matching point clouds comprises:
   identifying a subset of a locally registered representation of the structure as one of the one or more matching point clouds when a comparison between the subset of the locally registered representation of the structure and the target structural feature produces a predefined comparison result.

36. The system of claim 35, wherein the predefined comparison result is a predefined root mean square error between the subset of the locally registered representation of the structure and the target structural feature.

37. The system of claim 29, wherein the global registration process is a RANdom SAmple Consensus (RANSAC) process.

38. The system of claim 29, wherein the local registration process comprises determining an Iterative Closest Point (ICP) value.

39. The system of claim 29, wherein obtaining the global point cloud representation of the structure comprises one or more of:
   obtaining point cloud data by converting a CAD geometric representation of the structure;
   obtaining point cloud data by converting a shape discretization representation of the structure;
   obtaining point cloud data by converting a surface mesh representation of the structure;
   obtaining point cloud data by converting a volume mesh representation of the structure;
   obtaining point cloud data by converting sensor data collected during a flight test of the structure; and
   obtaining point cloud data by converting sensor data collected during a physical test of the structure.

40. The system of claim 29, wherein the one or more processors are further configured to perform:
   obtaining a rule that describes a volume associated with the target structural feature;
   obtaining contextual information about a locale of the target structural feature; and
   producing, for each of the one or more matching point clouds, a corresponding volume having a mesh spacing, a size, and a pose,
   wherein:
      the mesh spacing is produced in accordance with the rule; and
      the size and pose are each produced based on the contextual information about the locale of the target structural feature and on contextual information about a locale of said each of the one or more matching point clouds.

41. The system of claim 29, wherein the one or more processors are further configured to perform:
   obtaining one or more additional target point clouds that represent the target structural feature, wherein the one or more additional target point clouds are differently sized from one another and from the target point cloud;
   for each of the one or more additional target point clouds, supplying the global structural information and said each of the one or more additional target point clouds to the global registration process and producing therefrom one or more additional globally registered representations of the structure; and
   for each of the one or more additional target point clouds, supplying the globally registered representation of the structure and said each of the one or more additional target point clouds to the local registration process and producing therefrom one or more additional sets of one or more matching point clouds.

42. The system of claim 29, wherein obtaining the global point cloud representation of the structure comprises:
   obtaining point cloud data by converting a global non-point cloud representation of the structure into the global point cloud representation of the structure.

43. A structural feature recognizer for use in computational engineering, wherein the structural feature recognizer is configured to identify a structural feature of a structure, the structural feature recognizer comprising:
   circuitry configured to obtain a global point cloud representation of the structure;
   circuitry configured to obtain a target point cloud that represents a target structural feature, wherein the target point cloud is a subset of the global point cloud representation of the structure;
   circuitry configured to supply global structural information and the target point cloud to a global registration process and to produce therefrom a globally registered representation of the structure, wherein the global structural information is derived from the global point cloud representation of the structure; and
   circuitry configured to supply the globally registered representation of the structure and the target point cloud to a local registration process and producing therefrom one or more matching point clouds, wherein each of the one or more matching point clouds is a subset of the global point cloud representation of the structure.

44. The structural feature recognizer of claim 43, wherein the global structural information is the global point cloud representation of the structure.

45. The structural feature recognizer of claim 43, comprising:
   circuitry configured to produce a set of one or more extracted structural features based on the global point cloud representation of the structure, wherein each of the one or more extracted structural features is a pose invariant characterization of a local geometry around a point in the global point cloud representation of the structure,
   wherein the global structural information is the set of the one or more extracted structural features.

46. The structural feature recognizer of claim 45, wherein the circuitry configured to produce the set of the one or more extracted structural features based on the global point cloud representation of the structure comprises:
   circuitry configured to determine a Point Feature Histogram (PFH) based on the global point cloud representation of the structure.

47. The structural feature recognizer of claim 45, wherein the circuitry configured to produce the set of the one or more extracted structural features based on the global point cloud representation of the structure comprises:
circuitry configured to determine a Fast Point Feature Histogram (FPFH) based on the global point cloud representation of the structure.

48. The structural feature recognizer of claim 45, wherein the circuitry configured to produce the set of the one or more extracted structural features based on the global point cloud representation of the structure comprises:
circuitry configured to downsample the global point cloud representation of the structure to produce a downsampled global point cloud representation of the structure;
and circuitry configured to produce the set of the one or more extracted structural features from the downsampled global point cloud representation of the structure.

49. The structural feature recognizer of claim 43, wherein the circuitry configured to produce the one or more matching point clouds comprises:
circuitry configured to identify a subset of a locally registered representation of the structure as one of the one or more matching point clouds when a comparison between the subset of the locally registered representation of the structure and the target structural feature produces a predefined comparison result.

50. The structural feature recognizer of claim 49, wherein the predefined comparison result is a predefined root mean square error between the subset of the locally registered representation of the structure and the target structural feature.

51. The structural feature recognizer of claim 43, wherein the global registration process is a RANdom SAmple Consensus (RANSAC) process.

52. The structural feature recognizer of claim 43, wherein the local registration process comprises determining an Iterative Closest Point (ICP) value.

53. The structural feature recognizer of claim 43, wherein the circuitry configured to obtain the global point cloud representation of the structure comprises one or more of:
circuitry configured to obtain point cloud data by converting a CAD geometric representation of the structure;
circuitry configured to obtain point cloud data by converting a shape discretization representation of the structure;
circuitry configured to obtain point cloud data by converting a surface mesh representation of the structure;
circuitry configured to obtain point cloud data by converting a volume mesh representation of the structure;
circuitry configured to obtain point cloud data by converting sensor data collected during a flight test of the structure; and
circuitry configured to obtain point cloud data by converting sensor data collected during a physical test of the structure.

54. The structural feature recognizer of claim 43, comprising:
circuitry configured to obtain a rule that describes a volume associated with the target structural feature;
circuitry configured to obtain contextual information about a locale of the target structural feature; and
circuitry configured to produce, for each of the one or more matching point clouds, a corresponding volume having a mesh spacing, a size, and a pose,
wherein:
the mesh spacing is produced in accordance with the rule; and
the size and pose are each produced based on the contextual information about the locale of the target structural feature and on contextual information about a locale of said each of the one or more matching point clouds.

55. The structural feature recognizer of claim 43, comprising:
circuitry configured to obtain one or more additional target point clouds that represent the target structural feature, wherein the one or more additional target point clouds are differently sized from one another and from the target point cloud;
circuitry configured to produce, for each of the one or more additional target point clouds, one or more additional globally registered representations of the structure by supplying the global structural information and said each of the one or more additional target point clouds to the global registration process; and
circuitry configured to produce, for each of the one or more additional target point clouds, one or more additional sets of one or more matching point clouds by supplying the globally registered representation of the structure and said each of the one or more additional target point clouds to the local registration process.

56. The structural feature recognizer of claim 43, wherein the circuitry configured to obtain the global point cloud representation of the structure comprises:
circuitry configured to convert a global non-point cloud representation of the structure into the global point cloud representation of the structure.

57. A computational engineering system comprising the structural feature recognizer of claim 43.

* * * * *